United States Patent [19]
Minghetti et al.

[11] Patent Number: 5,437,948
[45] Date of Patent: Aug. 1, 1995

[54] PROCESS FOR ADJUSTING A PHOTOLITHOGRAPHIC EXPOSURE MACHINE AND ASSOCIATED DEVICE

[75] Inventors: Blandine Minghetti, Vaulnaveys le Haut; Annie Tissier, Saint Ismier; Alain Prola, Grenoble; Eric Schwartz, Seyssins, all of France

[73] Assignee: France Telecom, Paris, France

[21] Appl. No.: 90,669

[22] Filed: Jul. 12, 1993

[30] Foreign Application Priority Data

Jul. 10, 1992 [FR] France ............... 92 08610

[51] Int. Cl.⁶ ............................................. G03F 7/20
[52] U.S. Cl. ..................................... 430/30; 430/311; 355/55; 355/77; 250/201.4
[58] Field of Search ............ 430/30, 311; 355/55, 355/77; 250/201.4

[56] References Cited

U.S. PATENT DOCUMENTS

| | | | |
|---|---|---|---|
| 5,043,236 | 8/1991 | Tissier | 430/30 |
| 5,077,464 | 12/1991 | Ebbing | 250/201.4 |
| 5,303,002 | 4/1994 | Yan | 355/55 |

FOREIGN PATENT DOCUMENTS

| | | | |
|---|---|---|---|
| 0267721 | 5/1988 | European Pat. Off. | |
| 458250 | 2/1992 | Japan | 430/30 |
| 9215923 | 9/1992 | WIPO | 430/30 |

OTHER PUBLICATIONS

Microelectronic Engineering, vol. 9, No. 104, May 1989, Huynh et al., "Calibrated Exposure and Focus Test Patterns for Characterization of Optical Projection Printing".

*Primary Examiner*—Kathleen Duda
*Attorney, Agent, or Firm*—Larson and Taylor

[57] ABSTRACT

A process and device for adjusting a photolithographic exposure machine, which is used for manufacturing integrated circuits. A guide wafer being furnished with identical test patterns, these test patterns are successively illuminated with white light beam and the coefficient of reflectivity of each test pattern is thus measured. For each location of the corresponding pattern, the law of correspondence of the coefficient of reflectivity as a function of the defocusing parameter for the illuminating beam is thus established. The optimum sharp focus value is determined by criterion of threshold of the value of the coefficient of reflectivity.

9 Claims, 14 Drawing Sheets

Figure 1A:
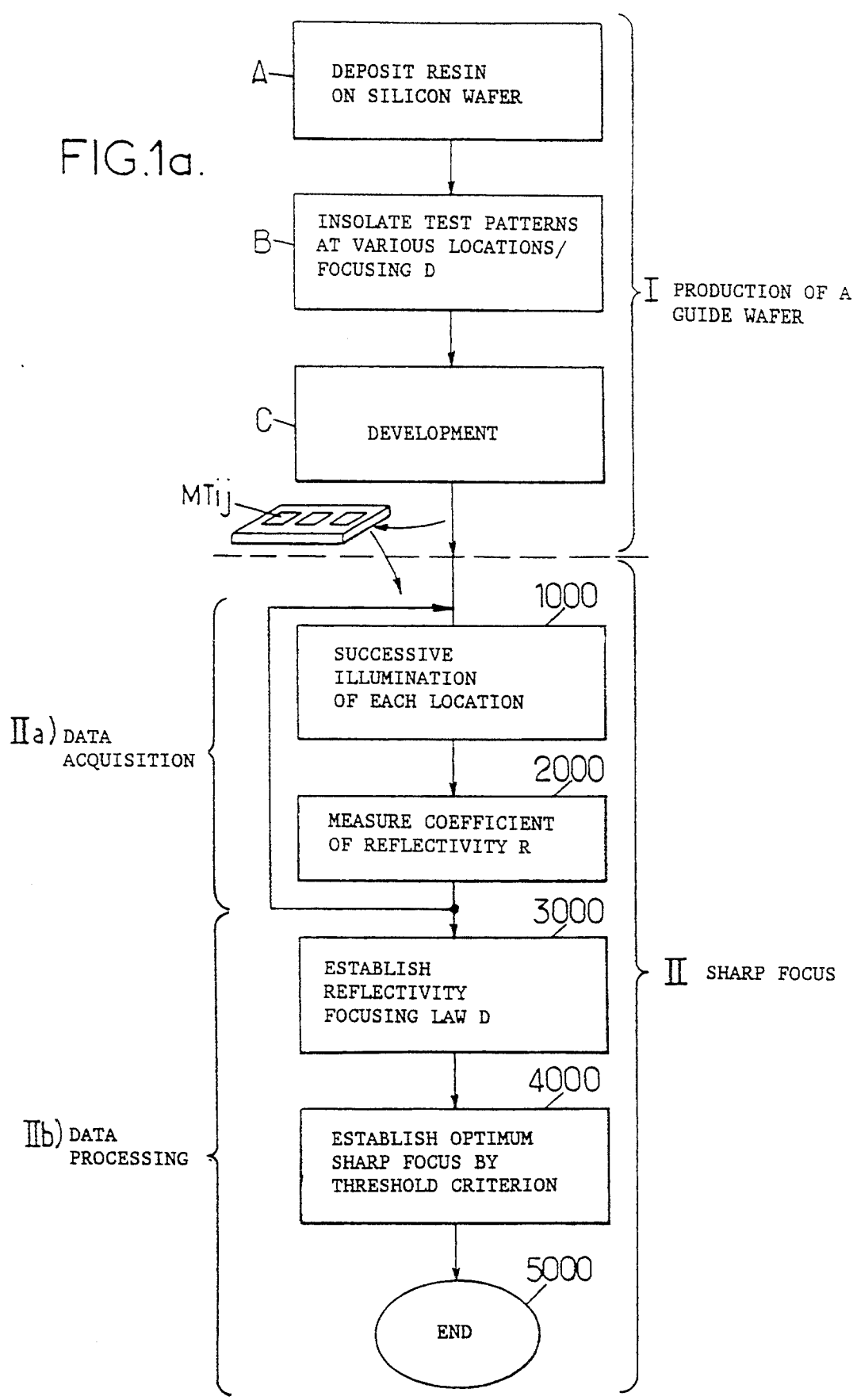
Figures 1, 2A:
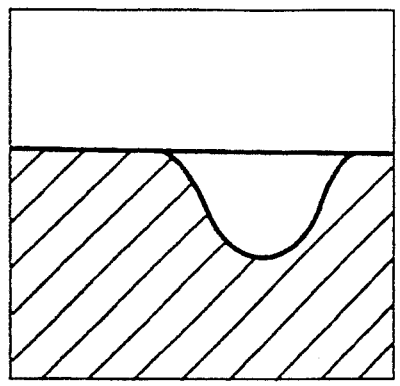
Figures 2, 2A:
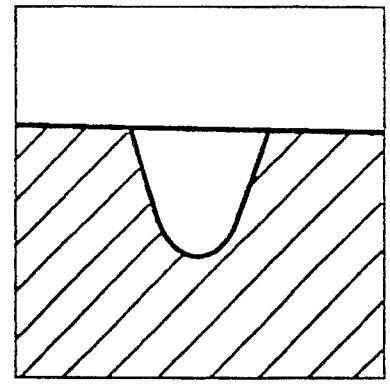

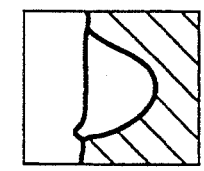
FIG. 1d-1
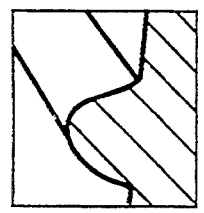
FIG. 1d-2
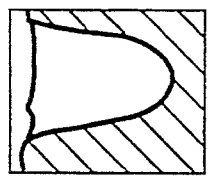
FIG. 1e-1
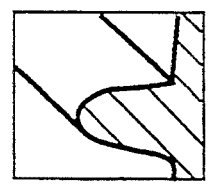
FIG. 1e-2
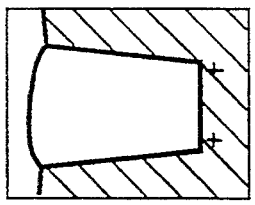
FIG. 1f-1
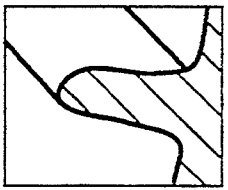
FIG. 1f-2
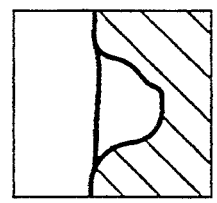
FIG. 1g-1
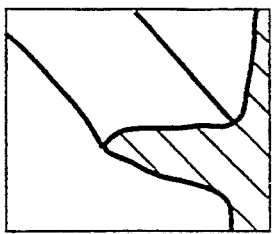
FIG. 1g-2
FIG. 1h-1
FIG. 1h-2
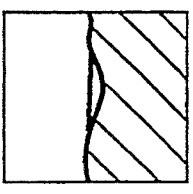
FIG. 1i-1
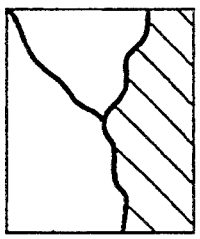
FIG. 1i-2
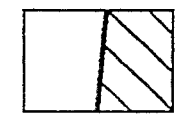
FIG. 1j
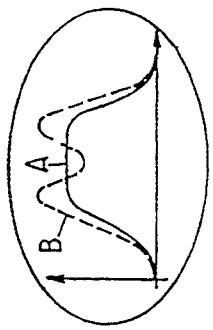
FIG. 1k

−2.4μ

−2.1μ

−1.8μ

−1.2μ

−0.9μ

−0.6μ

−0.3μ

FOCUS = 0μ

+0.3μ

+0.6μ

+1.2μ

+1.5μ

1.8μ

2.1μ

2.4μ

F = 0.2μ  85°

F = 0.4μ  84°

F = 0.6μ  84°

F = 0.8μ   83.5°

F = 1.0μ   82°

F = 1.2μ   79°

PROCESS FOR ADJUSTING A PHOTOLITHOGRAPHIC EXPOSURE MACHINE AND ASSOCIATED DEVICE

The invention relates to a process for adjusting a photolithographic exposure machine and to the associated device.

When using current photolithographic exposure machines, more commonly called photorepeaters, a constant worry is the improvement or maintenance of the quality of the adjustment of the optical resolution, in order to obtain exposed patterns on the surface of an integrated-circuit wafer coated with a resin of a corresponding quality. Conventionally, improvement of the resolution of photorepeaters can be effected either by using lenses of higher numerical aperture, or by reducing the wavelength of the exposure light.

However, the aforesaid procedures for improvement have the disadvantage of worsening the depth of field, DOF, proportional to $\lambda/NA^2$, the resolution, R, being proportional to $\lambda/NA$, were $\lambda$ designates the wavelength of the exposure light, and NA the numerical aperture of the lens used.

Furthermore, adjustment of the optical system for focusing the light on the surface of the resin depends on the ambient temperature and the atmospheric pressure. Automatic or software-controlled corrections may be envisaged. However, this type of correction is insufficiently accurate for depths of field of the order of a micrometer.

At least daily adjustment therefore turns out to be necessary. The methods currently used to effect such, very delicate, adjustments, are based either on visual observations by microscope, or on dimensional measurements, with or without cleavage, making it possible to obtain the profile of the resin outline.

Such methods have, however, major disadvantages such as the high dependence of the visual observation on the operator and the particularly lengthy and often destructive character as far as the dimensional methods are concerned.

Another method has recently been proposed by French Patent Application 2 642 188. This method consists in insolating the resin through a test pattern at various locations successively, a different sharp focus being made for each insolation. After development, the resin is made to flow and the wafer is then examined to determine the optimum insolation and to adopt the corresponding adjustment for the machine. This method, although satisfactory, has the disadvantage of requiring a flow step, the accuracy of the effects of which remain imprecise. The effects of the flow being difficult to optimise.

The purpose of the present invention is to remedy the disadvantages of the aforesaid prior methods.

Its subject is a process and a device for determining the sharp focus of a photolithographic exposure machine used to insolate structures on a substrate coated with a mask-forming resin, starting from a guide wafer furnished with identical test patterns at various locations.

The process and the device which are the subject of the invention are notable in that they consist in, and respectively make possible, successive illumination of the test patterns with white light in the vicinity of each location, by means of an illuminating beam, preferably oblique, measurement of the coefficient of reflectivity of each test pattern, and, establishment of the law of correspondence of the coefficient of reflectivity as a function, for each location, of the value of the defocusing or sharp focus parameter of the illuminating beam and determination by criterion of threshold of the value of the coefficient of reflectivity, a range of corresponding values of defocusing for the relative test pattern, making it possible to establish the optimum sharp focus value.

Figure 1B:
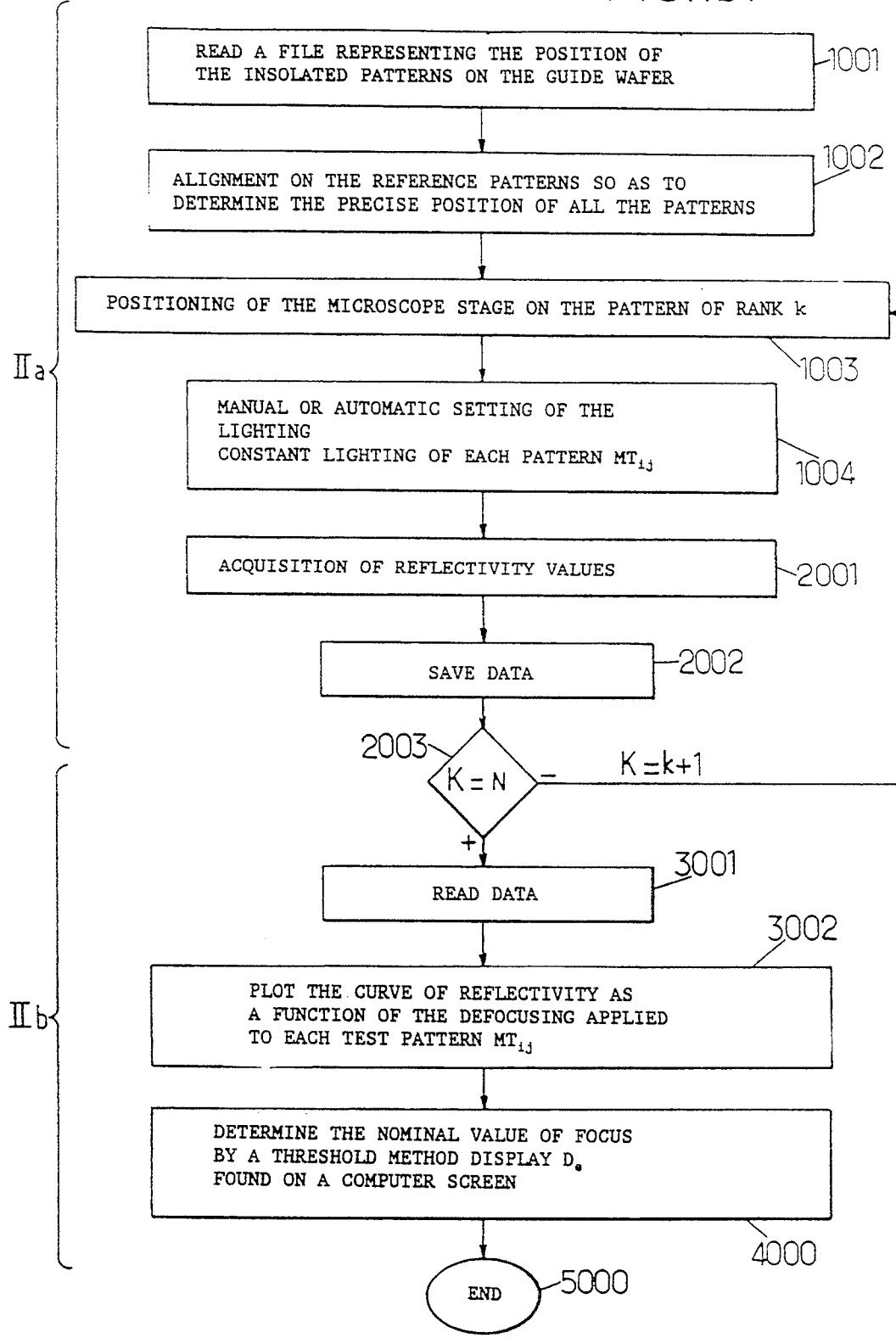
Figure 1C:
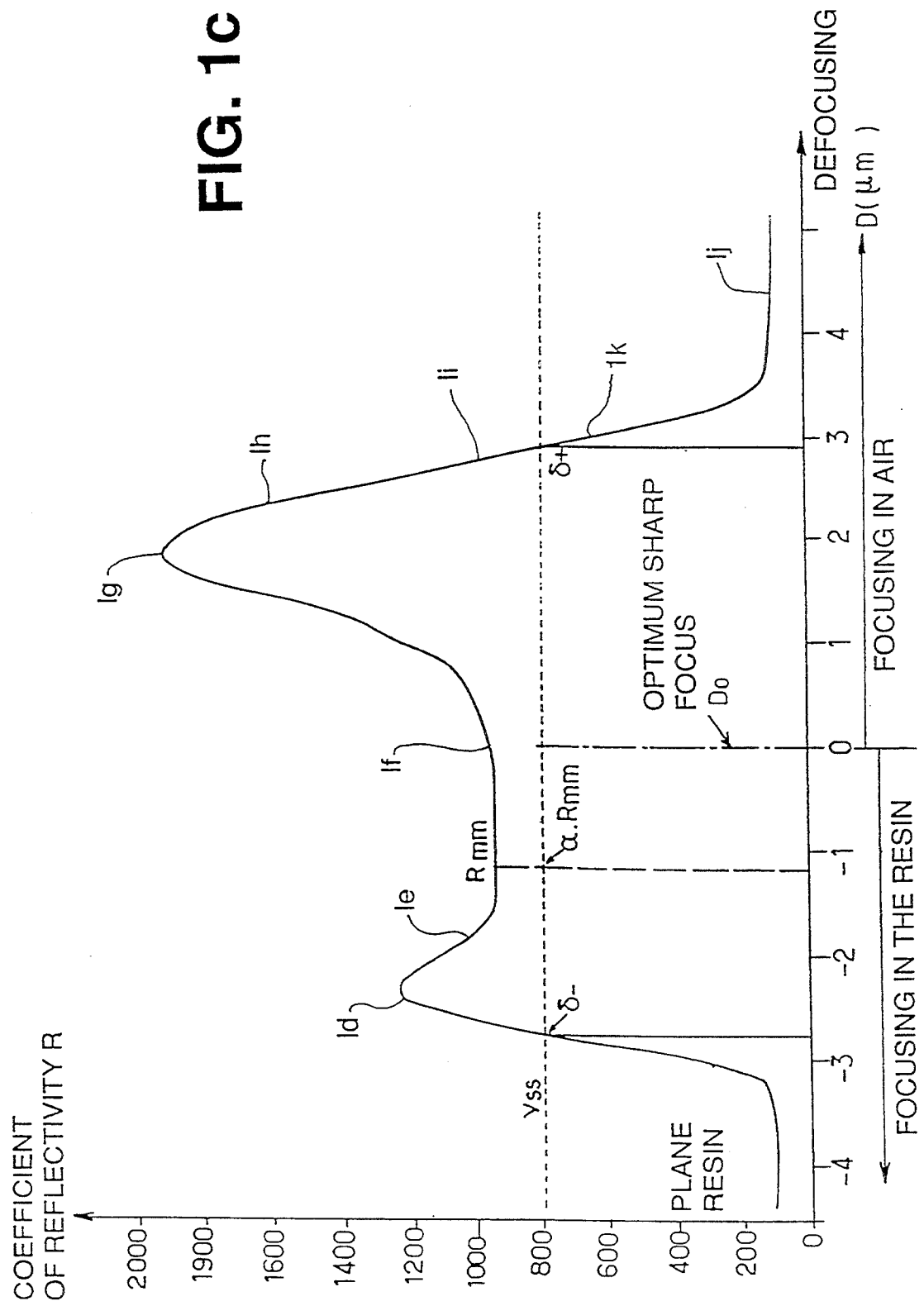
Figures 2, 2A, 3:
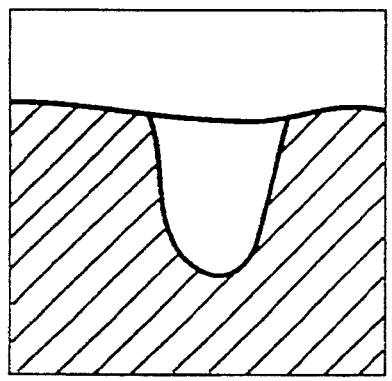
Figures 2, 2A, 3, 4:
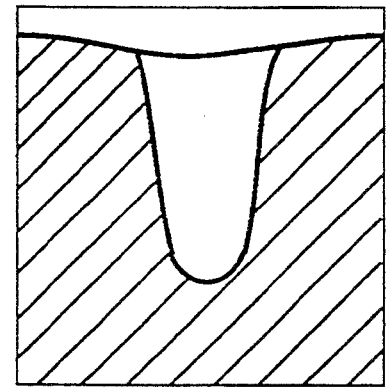
Figures 2, 2A, 3, 4, 5:
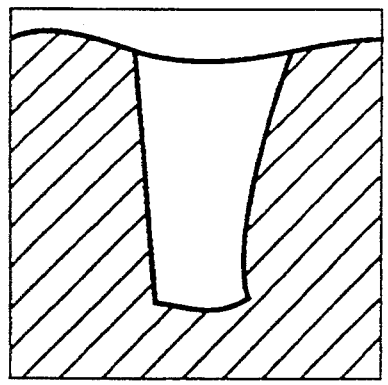
Figures 2, 2A, 3, 4, 5, 6:
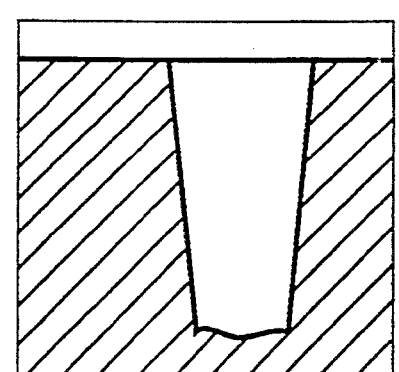
Figures 2, 2A, 3, 4, 5, 6, 7:
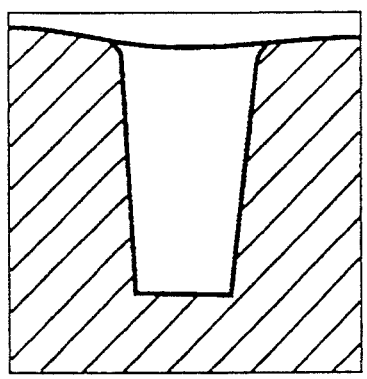
Figures 2, 2A, 3, 4, 5, 6, 7, 8:
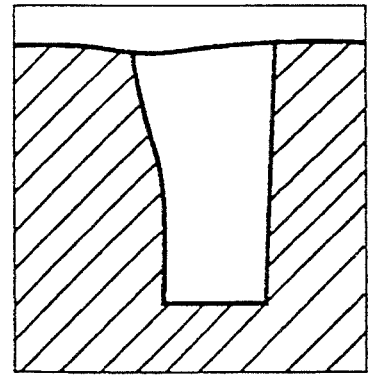
Figures 2, 2A, 3, 4, 5, 6, 7, 8, 9:
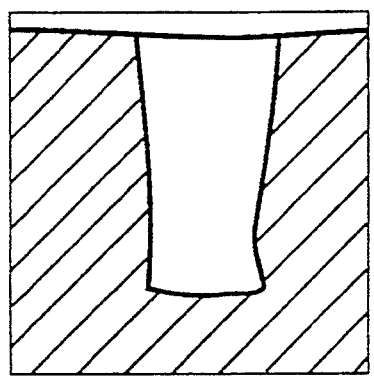
Figures 2, 2A, 3, 4, 5, 6, 7, 8, 9, 10:
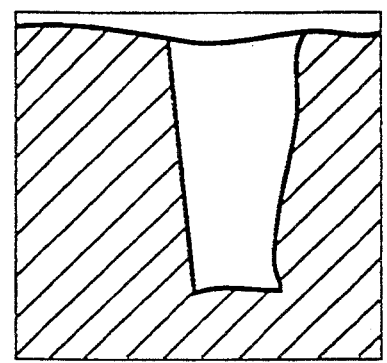
Figures 2, 2A, 3, 4, 5, 6, 7, 8, 9, 10, 11:
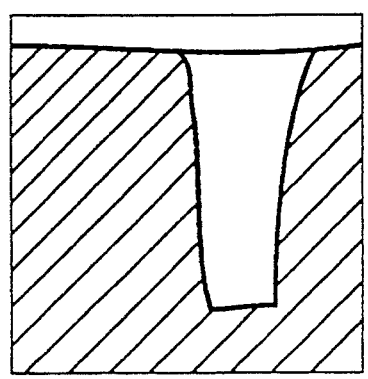
Figures 2, 2A, 3, 4, 5, 6, 7, 8, 9, 10, 11, 12:
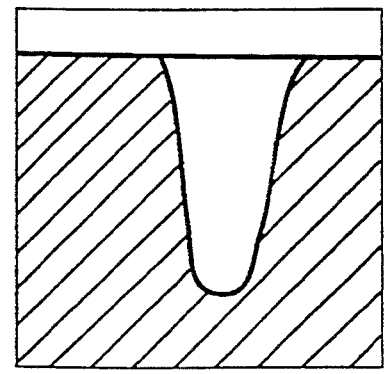
Figures 2, 2A, 3, 4, 5, 6, 7, 8, 9, 10, 11, 12, 13:
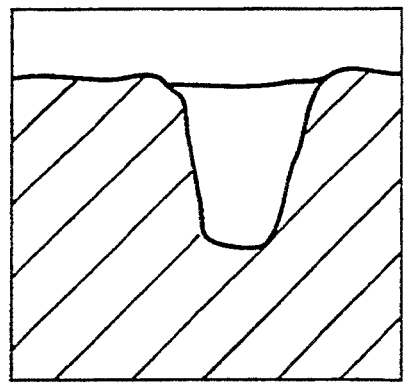
Figures 2, 2A, 3, 4, 5, 6, 7, 8, 9, 10, 11, 12, 13, 14:
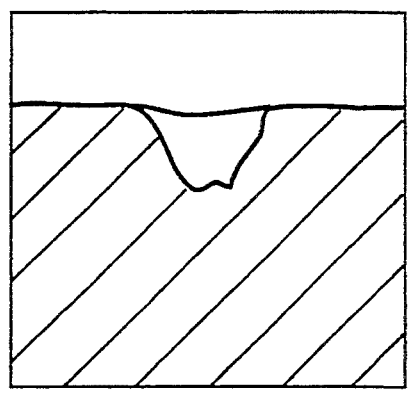
Figures 2, 2A, 3, 4, 5, 6, 7, 8, 9, 10, 11, 12, 13, 14, 15:
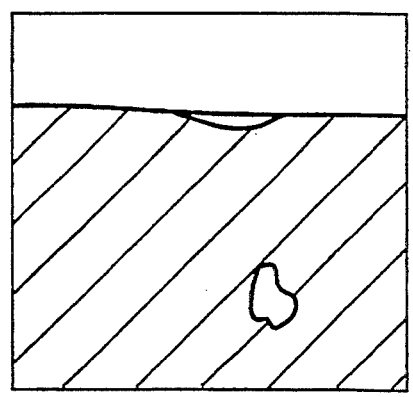
Figure 2B:
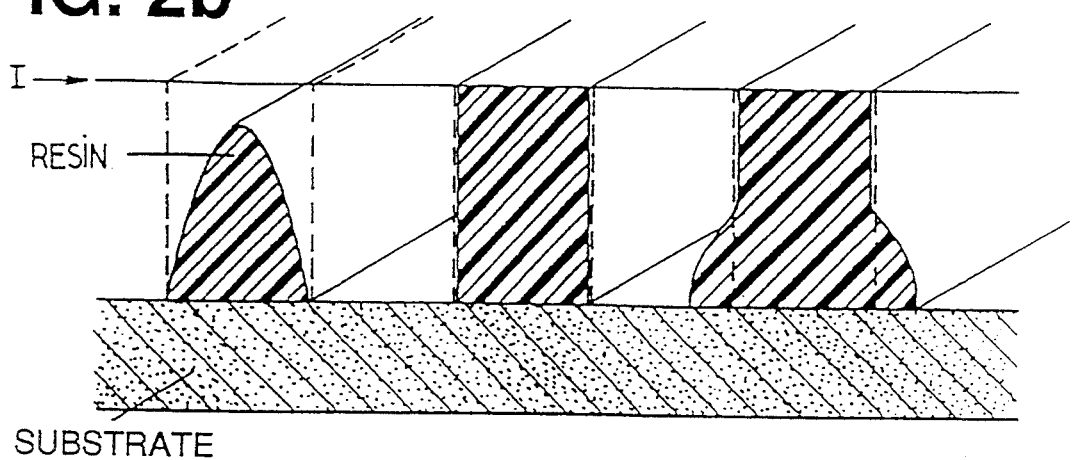
Figure 3:
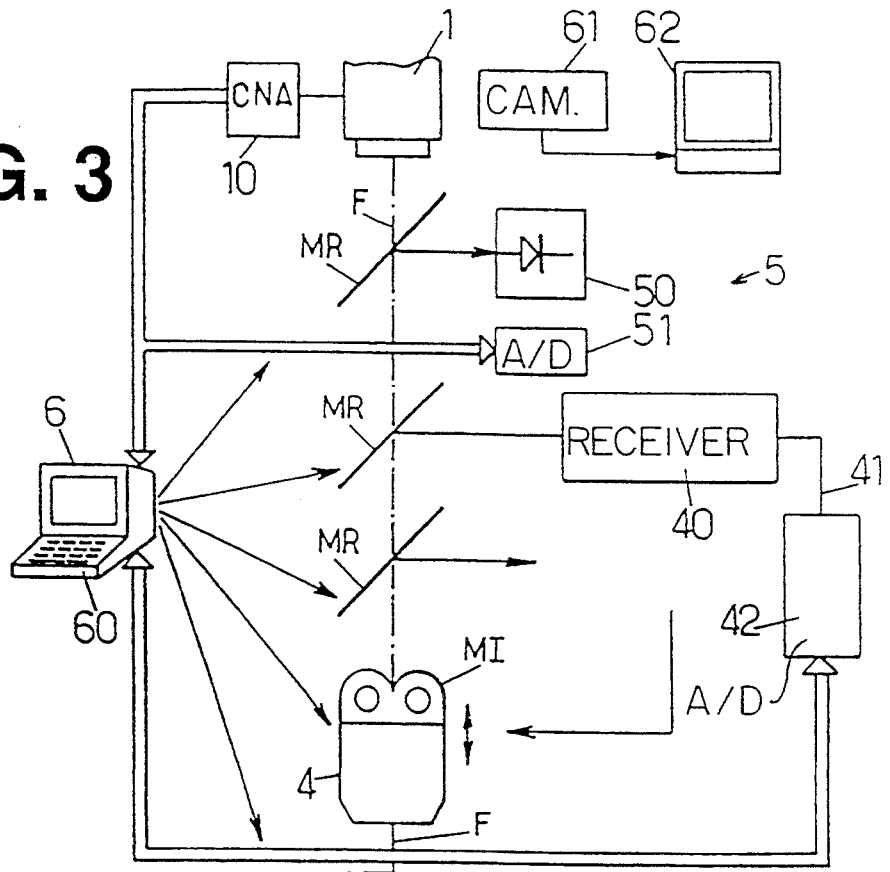
Figure 3:
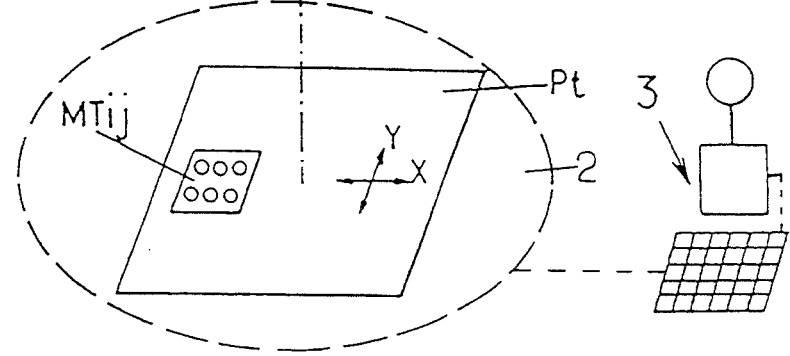
Figure 4C:
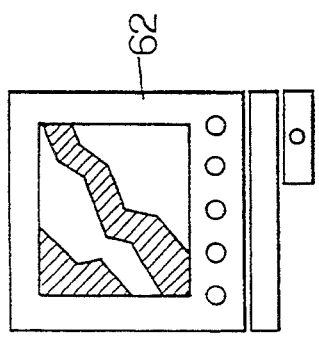
Figure 4B:
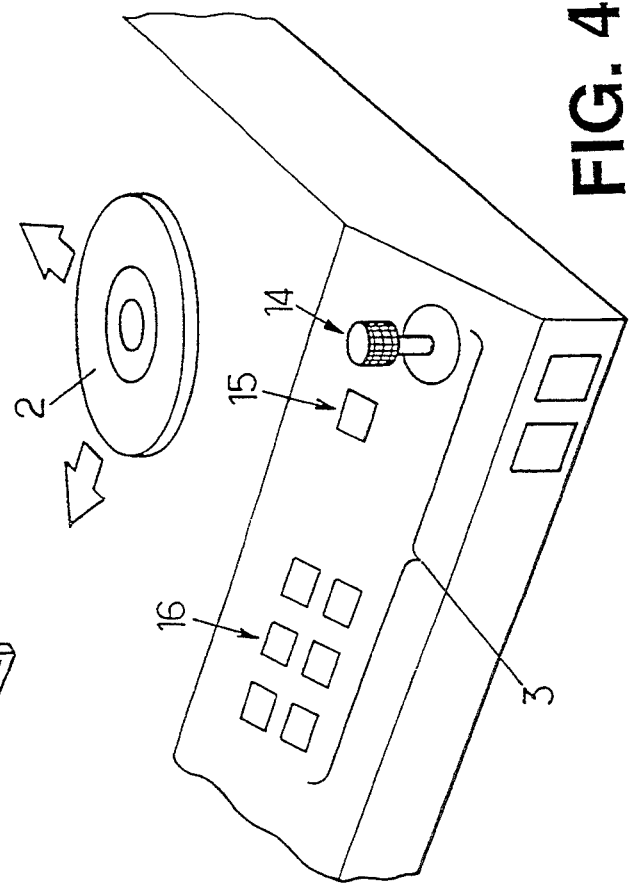
Figure 4A:
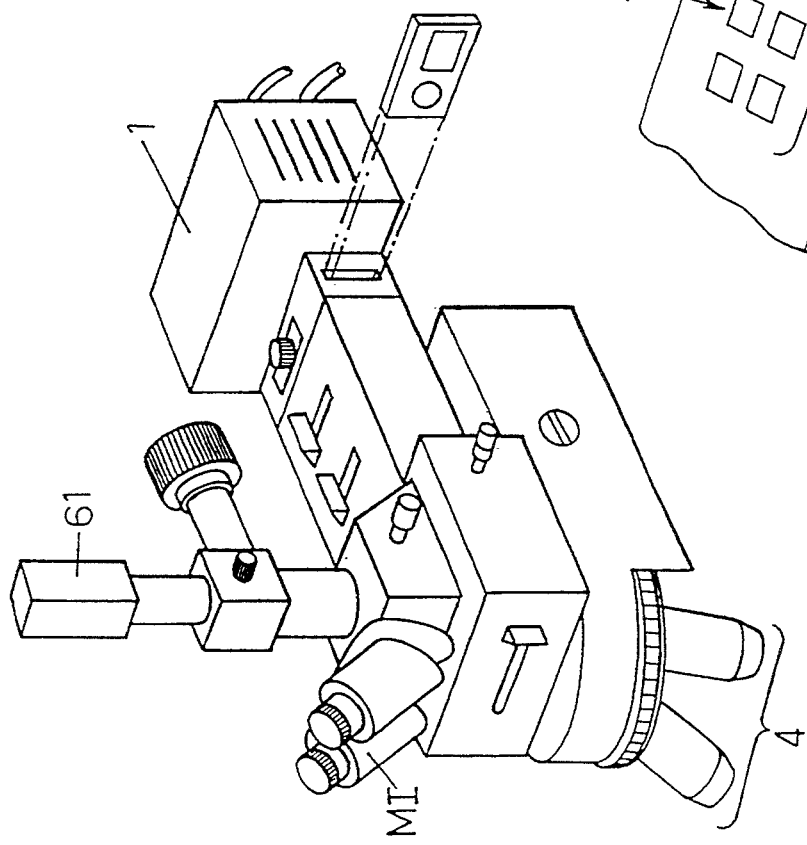
Figure 5A:
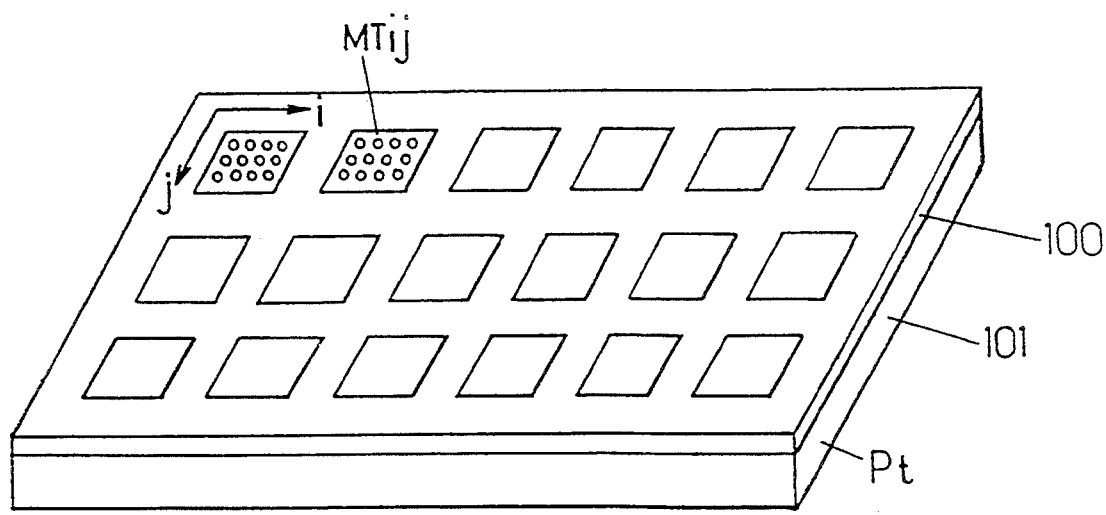
Figure 5B:
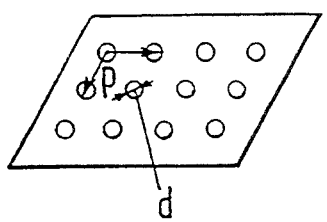
Figure 5C:
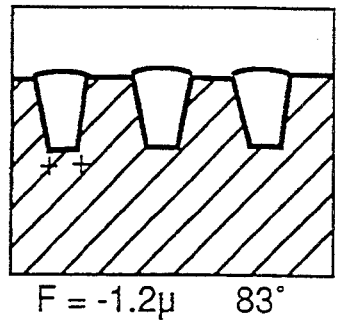
Figure 5D:
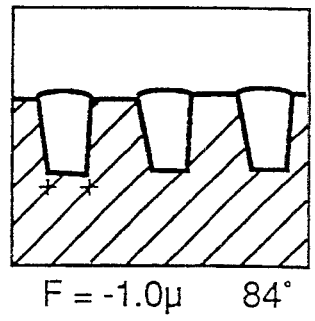
Figure 5E:
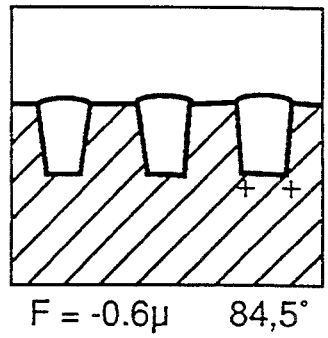
Figure 5F:
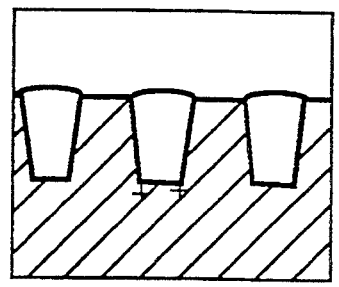
Figure 5G:
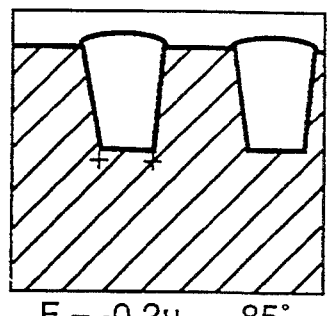
Figure 5H:
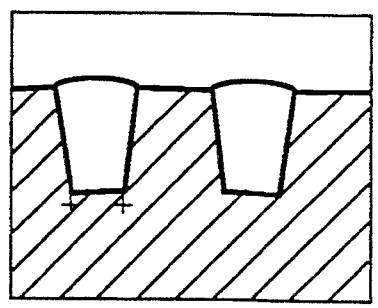
Figure 5I:
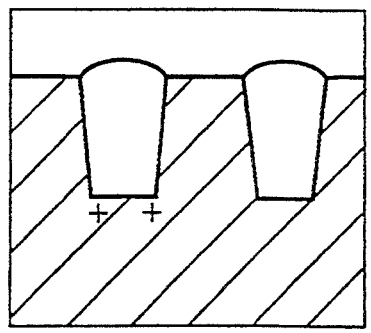
Figure 5J:
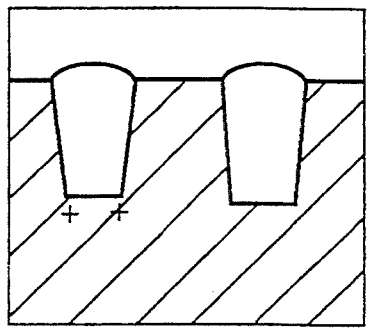
Figure 5K:
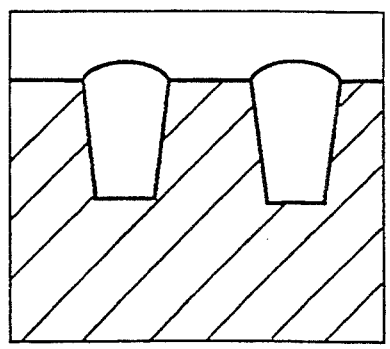
Figure 5L:
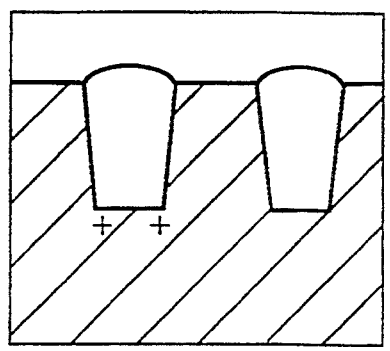
Figure 5M:
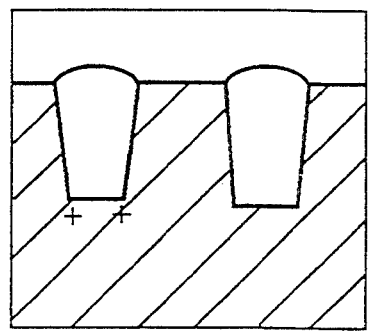
Figure 5N:
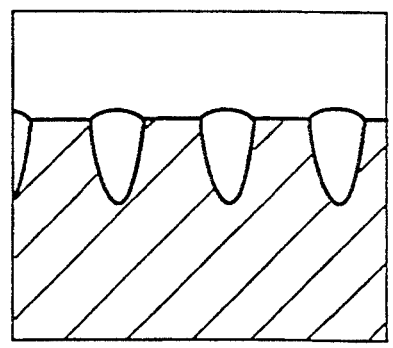

The process and the device which are the subjects of the present invention find application in the industry for the production of integrated circuits. They will be better understood on reading the description and on observing the drawings hereafter in which:

FIG. 1a represents, in the form of a block diagram, the various steps for implementation of the process which is the subject of the present invention, FIG. 1b represents also in the form of a block diagram, an advantageous embodiment of particular steps of the process according to the invention such as represented in FIG. 1a, FIG. 1c represents the law of correspondence of the coefficient of reflectivity of a guide wafer specially designed for the implementation of the process which is the subject of the present invention as a function of the relative defocusing of the illuminating and/or insolating beam, FIGS. 1d-1 through 1j represent noteworthy gravure hole profiles for corresponding identified zones of defocusing values shown in FIG. 1c, FIGS. 1d-2 through 1j represent noteworthy gravure groove profiles for corresponding identified zones of defocusing values shown in FIG. 1c, FIG. 1k represents the two envelopes which combine to form the curve depicted in FIG. 1c, FIGS. 2a-1 through 2a-15 represent, in section, a photographic sampling of the profile of holes formed in a resin layer of a guide wafer for successive discrete values of defocusing of the insolating beam as indicated, FIG. 2b represents, in section, the profile of grooves formed in a resin layer of a substrate wafer for different values of defocusing of the insolating beam, FIG. 3 represents, in the form of a block diagram, a device allowing the implementation of the process which is the subject of the present invention, FIGS. 4a–c represent details of certain component elements of the device represented in FIG. 3, FIGS. 5a–b respectively represent in perspective a guide wafer specially adapted for the implementation of the process which is the subject of the present invention and an enlarged view of a test pattern, FIGS. 5c–n represent longitudinal sections of the relevant sampled portions of the test patterns of FIG. 5a.

A more detailed description of the process for adjusting a photolithographic exposure machine and of the corresponding associated device will be given in connection with FIGS. 1a, 1b, 1c et seq.

Generally, it will be regarded that the process of adjustment which is the subject of the present invention makes it possible in fact to determine the optimum sharp focus of a photolithographic exposure machine used to insolate the structures on a substrate wafer coated with a photosensitive mask-forming resin.

It is indeed understood that this type of machine is used for the manufacture of integrated circuits, and, in particular the insolation, of the successive layers of the latter.

More specifically, the process which is the subject of the present invention is implemented starting from a guide wafer, denoted Pt, furnished with identical test patterns at various locations and arranged as a series of test patterns.

A more detailed description of the guide wafer Pt allowing the implementation of the process which is the subject of the present invention will be given subsequently in the description, the character of identity of the test patterns in particular being made clear.

In FIG. 1a, there has been represented diagrammatically the various steps of the process which is the subject of the present invention. As represented in the aforesaid figure, the process according to the invention can be subdivided into two main steps, a first step, denoted I, consisting in the production of a guide wafer, Pt, and consisting, as represented in the aforesaid figure, of three successive steps A, B, C, this step of producing a guide wafer not being regarded, properly speaking, as forming part of the process which is the subject of the present invention. Indeed, the step I for producing a guide wafer is indicated by way of example, the guide wafer, Pt, obtained following the implementation of the component steps A, B, C, of step I for producing a guide wafer, later being used for the implementation of the process proper.

Thus as will be observed in the aforesaid FIG. 1a, step I for producing a guide wafer can consist of a first step A, consisting in depositing a resin layer on a silicon wafer, followed by a step B of insolation of test patterns at various locations, these test patterns being arranged as a series of test patterns, and the insolation being carried out for each test pattern with a focusing of the image of the pattern, on the resin, which is different for each test pattern. It will in particular be understood that the focusing of the image of the pattern on the surface of the resin, that is to say on the air/resin interface, is a relative focusing, which must be understood as adjusted through a parameter D for defocusing with respect to the aforesaid air/resin interface.

Step B mentioned earlier is then followed by a developing step, denoted C, which makes it possible, after developing the photosensitive resin, to obtain the guide wafer Pt furnished with its series of test patterns. In FIG. 1a there has thus been represented the guide wafer Pt, furnished with its various test patterns, denoted $MT_{ij}$. It will be noted that the indices i, j make it possible to reference the successive addresses of each test pattern, and in particular, their position, as will be described later in the description.

Thus as will moreover be observed in FIG. 1a, the process which is the subject of the present invention then consists in a step 1000 in successively illuminating the test patterns $MT_{ij}$ with white light in the vicinity of each location with address i, J, by means of an illuminating beam.

The aforesaid step 1000 is followed by a step 2000 consisting in measuring the coefficient of reflectivity of each test pattern $MT_{ij}$. It is of course understood that having carried out the illuminating step 1000, for a test pattern with given address i, j, step 2000 for measuring the coefficient of reflectivity is performed immediately for this relevant test pattern and the succession of steps 1000 and 2000 mentioned previously is repeated for each test pattern, the repetition being symbolised in FIG. 1a by the backward return loop to step 1000. Of course, the data relating to the measurement of the coefficient of reflectivity R obtained in step 2000 are stored and the succession of steps 1000 and 2000 which are repeated for each test pattern thus constitutes a data aquisition step denoted IIa in FIG. 1a. The aforementioned data aquisition step IIa is then followed by a step IIb for processing this data. The data processing step comprises, as represented in FIG. 1a, a first step 3000 consisting in establishing the law of correspondence of the coefficient of reflectivity R for each location or test pattern $MT_{ij}$ as a function of the value of the defocusing or sharp focus parameter D of the illuminating beam.

It is of course understood that the beam for illuminating with white light is focused with constant value with respect to the surface of the resin of the guide wafer Pt, that is to say of the air/resin interface, and, that accordingly, by virtue of the defocusing of the beam for insolation of the test patterns of step B, there results therefrom, in the course of the scanning of each test pattern, $MT_{ij}$ by the illuminating beam, a corresponding defocusing D. It is likewise understood that the illuminating beam used in step 1000 can, at the start, be adjusted with a relative focusing, the best possible taking into account the means of conventional measurement available in the laboratory or on an industrial site, which of course makes it possible to apply the corresponding values of defocusing of each successive test pattern $MT_{ij}$ under similar conditions of accuracy of adjustment of the insolating beam which will be used subsequently by the exposure machine to produce particular structures, on one or more integrated-circuit substrate wafers. It is of course understood that the determination of the focusing or optimum sharp focus of the illuminating beam equals determination of the focusing or optimum sharp focus of the aforesaid insolating beam.

The aforementioned step 3000 is then followed by a step 4000 consisting in determining, by criterion of threshold of the value of the coefficient of reflectivity R, a range of corresponding values of defocusing or sharp focus for the relevant test pattern making it possible to establish the optimum sharp focus value. The aforementioned steps 3000 and 4000 constitute step IIb for processing the data previously acquired in a step IIa for acquiring these data and it comprises an end step, denoted 5000. The collection of steps 1000 to 4000 in fact constitutes the sharp focus step II in accordance with the process which is the subject of the present invention.

A more detailed description of the steps IIa for acquiring the data and IIb for processing the data will be given in connection with FIG. 1b.

In the aforesaid figure, step 1000 for successive illumination of each location can be subdivided into sub-steps 1001 for reading a file representing the position of the insolated test patterns on the guide wafer, Pt, and a sub-step 1002 for alignment on the reference patterns so as to determine the precise position of all the patterns $MT_{ij}$. It will be noted that the reference patterns can consist of preferential patterns, such as for example when the test patterns are laid out in a rectangular two-dimensional network, the test patterns situated at the ends of the rectangle delimiting this network.

The aforesaid step 1002 is then followed by a step for positioning the illuminating beam on the test pattern of rank k and in particular on the initial test pattern for which, by convention, k=1. It will be noted, as will be described subsequently in the description, that the position of the illuminating beam is in fact carried out by means of an X, Y stage and a microscope making it possible to afford a sighting on the relevant test pattern, that is to say the aforementioned test pattern of rank 1. It is of course understood that this test pattern of rank 1 corresponds to a test pattern $MT_{ij}$ with arbitrary given address i, j, for example that of a reference test pattern.

The aforementioned step 1003 is followed by a step 1004 for manually or automatically setting the luminous intensity of illumination to a chosen specified value. This step 1004 also comprises for example the sub-step for constant lighting of the relevant test pattern of rank k. Step 1004 is then followed by a sub-step 2001 for acquiring the values of reflectivity of the given test pattern $MT_{ij}$ of corresponding rank k and by a step for saving the data for the corresponding reflectivity parameter R, this step being denoted 2002, steps 2001 and 2002 forming, in fact, the step 2000 for measuring the coefficient of reflectivity R represented in FIG. 1a. The aforesaid step 2002 is followed by a step 2003 for testing the rank k of the relevant test pattern, this test consisting in a test of equality of the rank k with a value N representative of the number of test patterns used on the wafer and actually present on this guide wafer Pt. Upon a negative response to the test 2003, the value of the rank parameter k of the test pattern subjected to the data acquisition is incremented by one unit so as to go to step 1003, as symbolised by the return arrow in FIG. 1b, so as to subject the succeeding test pattern of rank k+1 to the same sub-steps 1003, 1004, 2001, 2002, 2003, as mentioned earlier.

Upon a positive response to the test 2003, that is to say when all the test patterns $MT_{ij}$ have been subjected to the data acquisition procedure IIa, the process which is the subject of the present invention then consists in implementing the data processing step IIb.

As represented in the aforesaid FIG. 1b, the latter can include, by way of non-limiting example, a sub-step 3001 for reading the data, that is to say the values of coefficient of reflectivity R for each relevant test pattern, this step 3001 being followed by a step 3002 consisting in establishing the law of correspondence of the coefficient of reflectivity R for each location, as a function of the value of the defocusing or sharp focus parameter of the illuminating beam. This step consists in fact in reporting the curve of reflectivity R as a function of the defocusing applied to each test pattern, when creating the latter on the guide wafer Pt, as already mentioned earlier.

Sub-step 3002 is then followed by a sub-step consisting in determining the nominal value of the focusing or optimum sharp focus through a threshold method, it being possible for this step to constitute the step 4000 mentioned earlier in connection with FIG. 1a.

The display of the nominal focusing value or of the optimum sharp focus found can then be displayed, for example on a computer screen.

Owing to a particularly advantageous aspect of the process which is the subject of the present invention, each test pattern $MT_{ij}$ consists of a network of holes, formed in the resin layer covering the guide wafer Pt.

It will in particular be noted that each test pattern is identical in the plane X, Y of the surface of the resin, that is to say of the air/resin interface, and that accordingly, both the dimension of the holes, that is to say their diameter d and the spacing of the network, a square or rectangular network, is identical. However, by virtue of the defocusing carried out when insolating test patterns, that is to say during step B of FIG. 1a, the holes for a relevant test pattern $MT_{ij}$ are identical, but exhibit differences of profile, and in particular of slope, from one test pattern to the next as a function of the applied defocusing, as will be described subsequently in the description.

In the aforesaid case, each test pattern consisting of a network of holes, and as has been represented in FIG. 1c in a diagram representing, as abscissa the defocusing parameter D in micrometers, and as ordinate the coefficient of reflectivity R measured for each test pattern under the aforementioned conditions, the optimum sharp focus corresponds to a range of values of the coefficient of reflectivity R which is substantially stationary and corresponds to the depth of field of the exposure machine, these values being flanked by two maxima (zones 1d and 1g) corresponding to a defocusing in the resin, and outside the resin respectively.

In FIG. 1c it is of course understood that the range of substantially stationary values corresponds to the reference 1f, the maximum corresponding to a defocusing in the resin corresponding to the reference 1d, whilst the maximum corresponding to a defocusing outside the resin corresponds to the reference 1g, with sample holes having these focus values therefrom represented in similarly noted FIGS. 1d-1 through 1i-1 and with sample grooves having these focus values therefrom represented in similarly noted FIGS. 1d-2 through 1i-2 and 1j.

According to a particularly advantageous aspect of the process which is the subject of the present invention, the accurate determination of the optimum sharp focus can be performed as follows:
the range of values flanking the optimum sharp focus value, this optimum sharp focus being defined as the relative defocusing equal to 0, when the focusing of the illuminating beam, and consequently of the insolating beam, corresponds to a focusing on the air/resin interface, this range of values is obtained by comparison with a threshold value. This range of values is then confirmed as range of values which corresponds to the optimum sharp focus flanking the optimum sharp focus value, as represented in FIG. 1c. This threshold value can be equal to a fraction of the minimum value of the coefficient of reflectivity R, lying between the two aforementioned maxima. It is then understood that the threshold value, denoted VSS, is taken equal to: $VSS = \beta Rmm$ where Rmm represents the smallest minimum value of the zone 1f situated between the two maxima 1d, 1g of FIG. 1c, with $\beta < 1$.

Thus, for a specified threshold value, VSS, the law of correspondence of the coefficient of reflectivity R, as a function of the defocusing value of the illuminating beam, thus makes it possible to define two corresponding abscissa values, $\delta-$ and $\delta+$, intersection of the threshold value with the aforesaid law of correspondence, and the optimum sharp focus defocusing value can then be defined for the exposure machine as the abscissa of the arithmetic mean of the end values of the range of corresponding values of optimum sharp focus, that is to say defined by the aforementioned abscissa values $\delta-$, $\delta+$, the optimum sharp focus value under defocusing then satisfying the relation:

$$Do = \tfrac{1}{2} \times (\delta - + \delta +).$$

Of course, the optimum defocusing value can then be defined arbitrarily as zero value, since it expresses the relative defocusing value with respect to the air/resin interface.

It will be noted that the process which is the subject of the present invention such as described earlier makes it possible to obtain a stable value of the optimum sharp focus defocusing parameter, by virtue of the quasi-symmetry of the law of correspondence of the coefficient of reflectivity in the zones of slope $1d$ and $1i$ of the latter, these zones flanking a range of optimum sharp focus value.

Generally, it will be noted that, so as to afford adequate accuracy of the measurement of the values of the coefficient of reflectivity R, this measurement, for each test pattern, is preferably carried out with black background. The black background makes it possible to be more sensitive to the defocusing, since it makes it possible to set into relief small variations in the slope of the resin, itself a function of the defocusing applied during insolation.

In FIGS. $1d$–$1j$ there have also been represented for the various characteristic zones of focusing of the illuminating beam, on the one hand, sectional views $1d$-1 to $1i$-1 of the holes forming the network of the guide plate in corresponding specimens and, on the other hand, profile views $1d$-2 to $1i$-2 and $1j$ of grooves produced under comparable conditions. It will in particular be noted that the most regular profile of the holes and correspondingly of the corresponding grooves is obtained when the defocusing corresponds to the range ($1f$) of the aforesaid reflectivity curve and, in particular, to the optimum sharp focus defocusing value. In this case, a hole is said to constitute an emergent hole, in so far as all the holes formed with the corresponding defocusing of the illuminating beam and ultimately of the insolating beam, make it possible to reach the surface of the substrate with a slope of the lateral walls of the hole which is greater than 85°.

A justification of the implementation of the process which is the subject of the present invention will be given hereafter.

Following successive experiments, it was possible to glean the collection of elements below:
the law of correspondence of the coefficient of reflectivity R as a function of the value of the defocusing parameter, such as represented in FIG. $1c$, corresponds substantially to the sum of two envelopes as shown in FIG. $1k$:
- a first envelope corresponding to the reflectivity due to the substrate, this first envelope exhibiting a bell-shaped curve as a function of the defocusing parameter D, and which depends both on the size of the holes, that is to say on the diameter of the holes, for a given network of holes, and on the nature of the substrate,
- a second envelope corresponding to the reflectivity due to the slopes of the walls of the holes formed in the resin, this reflectivity diminishing very rapidly when in an extreme zone of defocusing and exhibiting two substantially symmetric extrema separated by a zone of low reflectivity, this zone of low reflectivity corresponding of course to the maximum of the bell-shaped curve of reflectivity of the substrate, that is to say when the holes formed to constitute the test pattern for example are emergent holes for a maximum resin wall slope, the coefficient of reflectivity then due to the slope of the resin being a minimum, between the two aforesaid maxima, the two reflectivity curves, A and B, then together corresponding to the zone $1f$ of FIG. $1c$.

Thus, although the zone $1f$ of FIG. $1c$ can be used effectively only to determine a zone where the holes emerge on the surface of the substrate, the fact that the flanks of the corresponding maxima are substantially equal and symmetric makes possible, by virtue of the aforementioned threshold method, for a specified exposure machine, a reproducibility of the proposed method for two different plates, whose maximum variation in optimum defocusing is of the order of 0.2 micrometers.

With the same idea in mind, it will be noted that the optimum defocusing measured on a same guide plate, ten times in succession in accordance with the process which is the subject of the present invention, makes it possible to determine a maximum variation between the various measurements not exceeding 0.1 micrometers.

Of course, the processing of the values or data can be more sophisticated, in particular when spurious reflectivity peaks appear on the flanks of the curves corresponding to the aforesaid zones $1d$ and $1i$. These spurious peaks are for the most part due to problems inherent in defects in the wafers used, such as poor quality of the guide wafer, or contamination of the rear face leading to sizable local defocusing. Under these conditions, it may be appropriate to proceed to a smoothing of the values of the curve over several successive values of reflectivity for example.

Finally, it will be indicated in regard to the process which is the subject of the present invention, that the latter is particularly advantageous in so far as it was possible to observe, in the course of trials, that measurement of the coefficient of reflectivity R is not sensitive to a variation in the dose or intensity of energy used for the illumination of the holes constituting the test patterns $MT_{ij}$. The aforesaid trials have thus shown that for an irradiated energy for each illumination of between 50 to 170 mJ (millijoules), the optimum defocusing variation for a type of specified guide wafer did not exceed 0.1 micrometers.

Furthermore, it will be pointed out that the process which is the subject of the present invention, such as described earlier, can be implemented on any type of substrate, be it a silicon substrate or a rougher substrate such as aluminium or tungsten or even polycrystalline silicon substrates of silicon nitride, or silicon oxide.

Bearing in mind the above remarks, and in particular the differences in reflectivity noted for the various values of defocusing, as represented earlier in FIG. $1c$, the process which is the subject of the present invention also makes it possible to check the inclination or slope of the gravure flank, starting from the optimum sharp focus or position Do.

For this purpose, the process according to the invention consists in performing a shift of focusing of the insolating beam on the substrate wafer furnished with the resin layer, on which the structures are to be engineered. Of course, the shift of focusing is carried out in a range of values included within the range of values corresponding to the relative minimum lying between the two maxima of the law of correspondence of the coefficient of reflectivity and of the defocusing. Thus, the shift is carried out for the defocusing values lying in the zone $1f$ of FIG. $1c$, with respect to the optimum focusing value Do.

In FIGS. $2a$-1 through $2a$-15 have been represented, in section, photographic samples of gravure flanks of holes for defocusing values lying between $-2.4$ micrometers and 2.4 micrometers in increments of 0.3 micrometers.

It is thus noted that for various inclinations or slopes of the gravure profile, the defocusing shift is carried out, in the direction of the insolating beam, on the far side of the air/resin interface for the production of concave, oblique gravure flanks, that is to say in particular for the defocusing values lying between −2.4 micrometers and −0.6 micrometers substantially. The defocusing shift is carried out with a substantially zero or zero value for the production of straight gravure flanks substantially orthogonal to the resin/wafer/substrate interface, the substantially zero values corresponding in FIGS. 2a to the focusing shift values lying between −0.6 micrometers and +0.6 micrometers substantially.

The defocusing shift is on the contrary carried out on the near side of the air/resin interface for the production of so-called pedestal gravure flanks for the focusing shift values lying between 1.2 micrometers and 2.4 micrometers. It will however be noted that the pedestal shape appears in a significant manner only for shift values greater than 1.8 micrometers.

In FIG. 2b there has been represented, in section, gravure profiles of grooves corresponding substantially to the three zones mentioned earlier in connection with FIG. 2a.

A more detailed description of the device for adjusting a photolithographic exposure machine which is the subject of the present invention will now be given in connection with FIGS. 3 and 4.

In FIG. 3, it can be observed that the device according to the invention comprises a module for illumination by means of a beam of white light of a guide wafer Pt, the wafer being furnished with test patterns $MT_{ij}$ arranged as a series of test patterns. A support 2 is provided, the latter making it possible to support the guide wafer Pt and afford a positioning of the latter in a three-dimensional reference frame x,y,z of this wafer with respect to the focusing point of the white light beam. It is of course understood that the support 2 can consist of an x,y stage for example, it being possible for the positioning in z to be performed by the focusing of the beam and the defocusing of the latter.

Furthermore, a circuit 3 for control of the positioning of the guide wafer Pt is provided so as to afford a sequential scanning of the series of test patterns of the aforesaid guide plate, and a different relative defocusing for each test pattern of the series of test patterns printed on the guide plate with respect to the air/resin interface.

A collector element 4 for the light beam diffused by the corresponding test pattern, $MT_{ij}$, and by the surface of the guide wafer illuminated by the white light beam is provided. The latter can be produced by an optical objective including, in particular, an observation binocular, the assembly forming a microscope allowing visual observation.

Furthermore, a circuit 5 for measuring and storing the coefficient of reflectivity is provided, this coefficient being defined by the ratio of the intensity of the diffused beam to the intensity of the beam for illuminating with white light. This circuit 5 can include, advantageously, a photodiode, denoted 50, for receiving the diffused beam and an analog/digital converter 51, for example. Furthermore, the device comprises various reflecting mirrors, denoted MR, formed for example by semi-transparent mirrors, allowing on the one hand the transmission of the illuminating beam F of white light to the guide wafer Pt, and on the other hand, the retransmission of the diffused light beam collected by the collector element 4, on the one hand to the aforesaid photodiode 50, or to other circuits which will be described in more detail below.

Finally, a device 6 for computation and display of the law of correspondence of the coefficient of reflectivity and of the relative defocusing of the illuminating beam and of the guide wafer is provided, this device for computation and display also allowing display of the optimum sharp focus and a focusing shift at this optimum sharp focus, so as, if appropriate, to obtain the slope effects described earlier in the description.

Furthermore, according to an advantageous aspect of the device which is the subject of the present invention, the illuminating element 1 includes a loop for servo control of the intensity of the said illuminating beam F in order to obtain an intensity of the beam diffused by each test pattern and by the surface of the substantially constant guide wafer Pt. Advantageously, the aforesaid servo control loop can be constituted from a reflecting mirror MR reflecting a fraction of the diffused light beam, a receiver circuit 40 connected directly for example by an optical fibre link 41 and by an analog/digital converter 42 to the computing device 6. The computing device 6 can also be connected to the illuminating element 1 by a BUS link and by a digital/analog converter 10 thus enabling the aforesaid servo control loop to be provided. The device which is the subject of the invention thus makes it possible to work with a constant diffused intensity, which can be chosen so as to correspond to the maximum sensitivity of the receiving photodiode 50.

According to a particularly advantageous aspect of the device which is the subject of the present invention, the illuminating element 1 and the collector element 4 for the diffused beam can consist of an objective for illumination with black background.

In a practical embodiment, the collector element 4 of the diffused light beam was produced by means of a MS 09 microscope marketed in France by the NACHET company. This microscope is a modular microscope able to receive numerous accessories, thereby rendering its use very flexible in numerous sectors. Thus, the microscope turret used can receive five objectives of Union black background type.

This microscope is furthermore equipped with an infrared diode-based dynamic autofocusing system, which system makes it possible to guarantee preservation of the sharp focus during movement of the objective.

Furthermore, the aforesaid microscope makes it possible to go from light background/black background lighting, controlled by a manual selector, on the front face of the microscope.

In the light background mode, a field stop and an aperture stop make it possible to optimise the quality of the lighting. In FIG. 4a there has been represented a detail of the microscope and the assembly including the illuminating element 1 as well as the collector element 4. The illuminating element is powered by a 12-volt 50-watt halogen bulb mounted on a centrable support. Finally, the optical fibre for tapping the intensity of the diffused beam supplies a signal for servo control of the lighting signal via the computing device 6.

The aforesaid microscope is equipped with an observation binocular making it possible to select binocular visual observation or video observation and measurement with auxiliary output. The observation switch consists of a slider situated on the body of the binocular.

The aforesaid binocular can receive 10× observation eyepieces, one of which is equipped with a reticule so as to perform visual alignment. It will however be noted that the embodiment presently described is not limiting, and that in particular, a video camera as represented in FIG. 4a, bearing the reference 61, can be placed in the field of the objective 4 of the microscope. The function of the video camera 61 can be, by virtue of a software program for shape recognition, to perform automatic centring by siting and shape recognition on each relevant test pattern, or also to allow display of the sited test pattern via a high-resolution monitor (see FIG. 4c). The video camera 61 can consist of a standard black and white CCD type camera for example.

The video channel is furnished with a mount for the aforesaid camera 61, whereas the measurement channel is furnished with a photographic interface, and with a 10×M type photographic projection eyepiece. The photodiode cell 50 collects the flux delivered by the photographic projection eyepiece in the exit pupil over a field limited by a stop, a 1 mm stop as standard, or a 4 mm stop as an option. The measurement signals are transmitted directly to the computing device 6 via an analog/digital converter 51 mentioned earlier. The converter used was a 0 to 10 volts converter on 1096 points.

As regards the support 2 for the guide wafer Pt, consisting of a XY movable stage, this support can consist of a stage with large travel, 20, and equipped with an integrated-circuit wafer support, with vacuum suction. Of course, the support and the stage with large travel support the microscope and the assembly represented in FIG. 4b. The stage is driven via a RS 232 type link via the computing device 6. It will be noted that the circuit 3 for control of the positioning of the guide wafer includes, on the one hand, a control button, denoted 14, allowing the stage to travel along X and Y, as well as control keys, denoted 16, one of which, denoted IEE, allows the driving of the movable stage via the RS 232 link.

As regards the computing device 6, it will be noted that the latter advantageously comprises a calculator 60 furnished with its peripheral resources such as program memory, read-only memory and display memory, it being possible for this calculator 60 to consist of a PC AT or compatible type microcomputer.

It will be noted that this calculator is furnished with programs for running the procedure for determination of the optimum sharp focus and of the shift in this optimum sharp focus, through interactive dialogue with an operator.

It is thus understood that the collection of steps of the process which is the subject of the present invention such as defined in connection with FIGS. 1a, part II sharp focus, and 1b, are run via software for running the process. Thus, in particular, steps 1001, 1002, 1003, 1004, 2001, 2002, 2003, 3001, 3002 and 4000 represented in FIG. 1b correspond to programs and subroutines for running the corresponding process.

As regards step 1003 of FIG. 1b, in which positioning of the movable stage 2 of the microscope on the pattern of rank k is carried out, or at least as regards alignment on the reference patterns so as to determine the precise position of all the patterns in the preceding step 1002, the corresponding software requires, for the execution of this step 1002, a visual alignment or possibly an alignment made via a camera and shape-recognition software. In such a case, the operator takes in hand the running of the process via the knob 14 or control lever, which allows the movable stage to travel beneath the microscope along X or along Y. The speed of travel can then be modified by turning the lever about its axis. The lever 14 can be furnished with a button enabling the following function to be obtained when this button is kept pressed:

under index→index,
under stepped→fast step,
under slow speed→medium speed,
under fast speed→fast speed.

When the alignment is performed, the key 15 of the movable stage makes it possible to recommence the running of the procedure in automatic mode, the scanning of the various patterns $MT_{ij}$ of the guide wafer Pt being performed automatically by movement of the support 2 of the movable stage, according to a specified sequential law. Of course, the defocusing as a function of the position of the relevant test pattern is also performed automatically.

A more detailed description of a guide wafer Pt will be given in connection with FIGS. 5a and 5b.

According to FIG. 5a, each guide wafer Pt is formed by a substrate, such as a silicon substrate for example, bearing the reference 101, and a resin layer 100 in which is formed a plurality of identical test patterns $MT_{ij}$ arranged as a series of test patterns. By identical test patterns is meant that the dimension in i, j of each test pattern is identical, whilst the wafer varies from one test pattern to another.

According to an advantageous characteristic of the guide wafer which is the subject of the present invention as shown in greater detail in FIG. 5b, the test patterns are formed by a network of holes of spacing p and of dimension d which are determined with respect to the surface condition or mean roughness r of the substrate forming the guide wafer according to the relation:

$$d \leq \alpha r.$$

$$p \geq 2d.$$

It will be noted that in the aforesaid relations, d represents the diameter of holes forming the network, p forming the spacing of the aforesaid network. The parameter can lie between the values 2 and 5 for example.

In FIGS. 5c–n there has been represented various relevant longitudinal sectional views along the test patterns of FIG. 5a, each test pattern $MT_{ij}$ depicted corresponding in fact to a different defocusing value. It is observed in the aforesaid sectional views that the profiles of the holes forming the network of each test pattern are therefore different, the slope of the holes of the network being substantially symmetric with respect to the zero defocusing value corresponding to the value Do previously mentioned in FIG. 1c.

As regards the dimension of the holes forming the aforesaid network, it will be noted that this dimension must be close to the limit of resolution of the photolithographic exposure machine whose adjustment is to be performed by implementation of the process which is the subject of the present invention. Furthermore, the illuminating dose used, that is to say the luminous intensity for illuminating each test pattern $MT_{ij}$, must likewise be minimal, so as to obtain holes which are practically completely plugged for high defocusing values. Compare FIG. 1c, zones 1i and 1j. It will furthermore be pointed out that the spacing p of the network is not a critical parameter, since it influences essentially the level of reflectivity of the network.

The previously mentioned trials were carried out in a hole of 0.6 micrometers and a spacing of 2.4 micrometers, on a photorepeater of numerical aperture 0.40. Finally, the dimension of each network constituting a relevant test pattern $MT_{ij}$ is at least 50×50 micrometers square.

There have thus been described a process for adjustment of a photolithographic exposure machine and a device allowing the implementation of this method, which are particularly powerful since they allow the checking of the stability of the focusing of these exposure machines with, by comparison with the processes or devices of the prior art, the following advantages: excellent reproducibility of an implementation of the process, insensitivity to change of reticule or to the lighting level within the limits indicated earlier in the description, ease of the pattern of the network to be produced, independence of the nominal focusing value in respect of the operator running the measurements and speed of both exposure and reading of the results.

We claim:

1. A process for determining a value of sharp focus of a photolithographic exposure machine used to insolate structures on a substrate wafer coated with a maskforming resin, using a guide wafer furnished with a series of identical test patterns, said process comprising the steps of:
   successively insolating each of the test patterns with white light from an illuminating beam with the illuminating beam having a different adjusted value of focus for each test pattern,
   measuring a coefficient of reflectivity of each test pattern,
   establishing a law of correspondence of the measured coefficients of reflectivity as a function of the different adjusted values of the focus of the illuminating beam used at each respective test pattern, and
   determining, by criterion of threshold of the value of the coefficient of reflectivity, a range of corresponding values of focus for the test patterns, and an optimum sharp focus value for the guide wafer and hence for the substrate wafer from this range.

2. A process according to claim 1, wherein said insolating step includes the step of creating in each of the test patterns a network of holes, and wherein said determining step determines the optimum sharp focus value from within a range of substantially stationary values of the coefficient of reflectivity of the law of correspondence flanked by two maxima of values of reflectivity corresponding respectively to a defocusing in the maskforming resin and outside of the maskforming resin.

3. A process according to claim 2, wherein said determining step for determining the range of corresponding values of the focus includes the steps of comparing the range of corresponding values with a threshold range of focus values lying between an intersection of the law of correspondence with a threshold value of reflectivity which threshold value is equal to a fraction of the minimum value of the coefficient of reflectivity lying between the two maxima, and thereby confirming that the range of corresponding values lies within the threshold range of focus values.

4. A process according to claim 2, wherein said determining step of the optimum sharp focus value includes the step of selecting an arithmetic mean of the corresponding focus values of the two maxima values of reflectivity.

5. A process according to claim 4, wherein the holes of the test patterns have a slope depending on the focus value, and further including the steps of:
   shifting the focus value of the illuminating beam within a limited range of values of focus defined by the corresponding focus values between to the maxima values of reflectivity; and
   checking of the slopes of the holes of the test patterns formed within the limited range of values.

6. A process according to claim 5 and further including the step of choosing a value of focus for the illuminating beam to a far side of an air/maskforming resin interface from an illuminating beam source such that concave or oblique slopes are thereby subsequently created by use of the illuminating beam.

7. A process according to claim 5 and further including the step of choosing a value of focus for the illuminating beam at an air/maskforming resin interface such that slopes orthogonal to the air/maskforming resin interface are thereby subsequently created by use of the illuminating beam.

8. A process according to claim 5 and further including the step of choosing a value of focus for the illuminating beam to a near side of an air/maskforming resin interface from an illuminating beam source such that pedestal shaped slopes are thereby subsequently created by use of the illuminating beam.

9. A process according to claim 1, wherein said measuring step includes the providing of a black field background.

* * * * *